United States Patent [19]
Kim et al.

[11] Patent Number: 5,978,935
[45] Date of Patent: Nov. 2, 1999

[54] METHOD FOR BUILT-IN SELF-TESTING OF RING-ADDRESS FIFOS HAVING A DATA INPUT REGISTER WITH TRANSPARENT LATCHES

[76] Inventors: Ilyoung Kim, 66 Franklin Dr., Plainsboro, N.J. 08536; Larry Ray Fenstermaker, 356 Meyer Rd., Nazareth, Pa. 18064; Yervant Zorian, 2709 Taft Ave., Santa Clara, Calif. 95051

[21] Appl. No.: 08/947,136

[22] Filed: Oct. 8, 1997

[51] Int. Cl.[6] .................................................. G06F 11/00
[52] U.S. Cl. .................. 714/42; 714/54; 714/40
[58] Field of Search ................... 714/42, 43, 44, 714/48, 53, 54, 2, 5, 25, 27

[56] References Cited

U.S. PATENT DOCUMENTS

| | | | |
|---|---|---|---|
| 4,404,676 | 9/1983 | DeBenedictis | 714/798 |
| 4,887,267 | 12/1989 | Kanuma | 714/726 |
| 5,153,509 | 10/1992 | Dalrymple et al. | 324/73.1 |
| 5,513,318 | 4/1996 | van de Goor et al. | |
| 5,537,632 | 7/1996 | Gorshe | 714/42 |

OTHER PUBLICATIONS

"An Effective BIST Scheme for ROM's" by Yervant Zorian, *IEEE Transactions on Computers*, vol. 41, No. 5, May, 1992, pp. 646–653.

"Principles of CMOS VLSI Design, A Systems Perspective" by Neil H.E. Weste et al., Addison–Wesley Publishing Company, 2nd Edition Copyright (1993) pp. 19–21.

"HL350C 3 Volt, 0.35 $\mu$m CMOS Standard–Cell Library" by Lucent Technologies—Bell Labs Innovations, System ASIC, Data Book—Jun., 1996, pp. 6–25 and 6–55.

Lucent Technologies Inc., Bell Labs Innovations, HL350CDE 3 Volt Design Enhanced 0.35 $\mu$m CMOS Standard–Cell Library, System ASIC Data Book (Dec. 1996).

*Primary Examiner*—Ly V. Hua
*Attorney, Agent, or Firm*—Darby & Darby

[57] ABSTRACT

A dual-port RAM-type ring-address FIFO including a data input register with a set of transparent latches is tested by causing the FIFO to execute a test method comprised of a set of interwoven steps. Upon execution, the steps of the method cause the FIFO to manifest all possible memory, address and functional faults. This test method manifests faults by causing the FIFO to alter the state of various flags it normally sets and by altering the logic state of the data normally produced by the FIFO.

20 Claims, 4 Drawing Sheets

FIG. 3
TESTING THE FIFO 100

| # | OPERATION O(1) | O(n) | FF | EF | DETECTED FAULTS |
|---|---|---|---|---|---|
| 1 | RS | | 0 | 1 | |
| 2 | RCK ‖ RE=1 | | 0 | 1 | ORP, RAck |
| 3 | WCK ‖ WE=0 | | 0 | 1 | WE, WAck |
| 4 | w0 | | 0 | 0 | WAck |
| 5 | RCK ‖ RE=1 | | 0 | 0 | RE, RAck |
| 6 | r0 | | 0 | 1 | W0→R0 RAck |
| 7 | RT | | 0 | 0 | RT |
| 8 | $\Uparrow_0^{n-1}$ | SL0 | | | |
| 9 | RS | | 0 | 1 | RS |
| 10 | $\Uparrow_0^{n-1}$ | w0 | 0 | 0 | EF, FF |
| 11 | | r0 | 0 | 1 | EF, FF |
| 12 | RT | | | | |
| 13 | $\Uparrow_0^{n-2}$ | r0 ‖ DI:=1 wi1, wi0, w1 | 1 | 0 | SAF, MPF, RI, WI, LF |
| | n-1 | r0, wi1, wi0, wi1 | | | |
| 14 | $\Uparrow_0^{n-2}$ | ri1, w1, wi0, r0, wi1 | 1 | 0 | FF, AF-IV, TF, RI, WI, SOF, SAF |
| | n-1 | ri1, w1 wi0, r0, w1 | | | |
| 15 | $\Uparrow_0^{n-2}$ | r1 ‖ DI:=0, wi0, wi1, w0 | 1 | 0 | SAF, MPF, LF, AF-I |
| | n-1 | r1, wi0, wi1, wi0 | | | |
| 16 | $\Uparrow_0^{n-2}$ | ri0, w0, wi1, r1, wi0 | 1 | 0 | FF, AF-IV, TF AF-1, SOF, SAF |
| | n-1 | ri0, w0, wi1, r1 w0 | | | |
| 17 | $\Rightarrow_0^{B-1}$ | wi0→, ri0→ | | | PSCF |
| 18 | $\Rightarrow_0^{B-1}$ | wi1→, ri1→ | | | PSCF |
| 19 | WCK ‖ WE=1 | | 1 | 0 | OWP, WAck |
| 20 | DEL | | 1 | 0 | |
| 21 | $\Uparrow_0^{n-1}$ | r0 | 0 | 1 | DRF, AF-II |
| 22 | $\Uparrow_0^{n-2}$ | w1 | 0 | 0 | AF-II |
| 23 | w1 | | 1 | 0 | |
| 24 | DEL | | 1 | 0 | |
| 25 | $\Uparrow_0^{n-1}$ | r1 | 1 | 0 | DRF |

FIG. 4
TESTING THE FIFO 100'

| # | OPERATION O(1) | O(n) | FF | EF | DETECTED FAULTS |
|---|---|---|---|---|---|
| 1' | RS | | 0 | 1 | RS |
| 2' | $\Uparrow_0 n-1$ | w0 | 0 | 0 | EF, FF |
| 3' | | r0 | 0 | 1 | EF, FF |
| 4' | RT | | | | |
| 5' | $\Uparrow_0 n-1$ | w0 | | | |
| 6' | $\Uparrow_0 n-2$ | r0 ∥ DI:=1 wi1, wi0, w1 | 1 | 0 | SAF, MPF, RI, WI, LF |
| | n-1 | r0, wi1, wi0, wi1 | | | |
| 7' | $\Uparrow_0 n-2$ | ri1, w1, wi0, r0, wi1 | 1 | 0 | FF, AF-IV, TF, RI, WI, SOF, SAF |
| | n-1 | ri1, w1, wi0, r0, w1 | | | |
| 8' | $\Uparrow_0 n-2$ | r1 ∥ DI:=0, wi0, wi1, w0 | 1 | 0 | SAF, MPF, LF, AF-I |
| | n-1 | r1, wi0, wi1, wi0 | | | |
| 9' | $\Uparrow_0 n-2$ | ri0, w0, wi1, r1, wi0 | 1 | 0 | FF, AF-IV, TF AF-1, SOF, SAF |
| | n-1 | ri0, w0, wi1, r1, w0 | | | |
| 10' | $\Rightarrow_0 B-1$ | wi1→, ri1→ | | | PSCF |
| 11' | DEL | | 1 | 0 | |
| 12' | $\Uparrow_0 n-1$ | r0 | 0 | 1 | DRF, AF-II |
| 13' | $\Uparrow_0 n-1$ | w1 | 1 | 0 | AF-II |
| 14' | DEL | | 1 | 0 | |
| 15' | $\Uparrow_0 n-1$ | r1 | 1 | 0 | DRF |

METHOD FOR BUILT-IN SELF-TESTING OF RING-ADDRESS FIFOS HAVING A DATA INPUT REGISTER WITH TRANSPARENT LATCHES

FIELD OF THE INVENTION

This invention relates to a technique for accomplishing Built-In Self-Testing of a ring-address FIFO having a data input register with transparent latches and other Design For Testability features, to detect memory faults, addressing faults and functional faults.

BACKGROUND OF THE INVENTION

First-In First-Out memories (FIFOs) are used in a variety of electronic circuits for buffering data transferred between a pair of circuits that operate at different clock rates. Generally, there are two types of FIFOs. The first type of FIFO is the shift register type that uses a self-clocking register for shifting data from a write port to a read port. The second type of FIFO utilizes a Random Access Memory (RAM) as its storage element, rather than a shift register. The RAM within the RAM-type FIFO may have a single (combined) read/write port or separate (dual) ports for reading and writing data, the latter being more popular. The most common type of dual-port RAM-type FIFO utilizes a ring-type addressing mechanism comprised of a pair of n-bit shift registers (where n is an integer, corresponding to the number of storage rows in the RAM). Each shift register is associated with one of the read and write ports, respectively, of the RAM and operates to sequentially address the RAM so that a B-bit word (where B is an integer, corresponding to the number of bits in a word) may be read from, or written to, the addressed storage location, respectively. In addition, during normal operation of the FIFO, as a result of a read or write operation on a given memory location of the RAM, the FIFO causes the read or write shift register, respectively, to be incremented to address the next successive memory location in the RAM. Moreover, the input port of the RAM is coupled to a data input register that acts as a buffer to temporarily store incoming data supplied on a Data Input line before such data is supplied to the RAM input port.

From a reliability standpoint, it is desirable to test all aspects of the ring-address FIFO. In the past, FIFOs have been tested by parametric, functional and asynchronous tests. However, such tests do not reliably detect all possible faults, including faults associated with the memory, the addressing mechanism, and the overall functionality of the FIFO. Fault models and tests have been described in the literature for detecting faults in RAMs. In addition, U.S. Pat. No. 5,513,318 (hereinafter the '318 patent) to Ad. J. van de Goor and Yervant Zorian, provides a technique to detect memory, addressing and functional faults that may occur in a dual-port RAM-type ring-address FIFO. That patent is incorporated herein in its entirety by reference.

However, the method described in the '318 patent applies to a dual-port RAM-type ring-address FIFO with a standard data input register containing edge-triggered latches. In addition, the '318 patent applies to such a FIFO with Design For Testability features, including a Built-In Self-Test controller. A latch is a bistable circuit (i.e., a flip-flop) that is set and reset by appropriate input signals. It is the means by which the data input register buffers data for the input port to the RAM. An edge-triggered latch applies data present in the data input register to the input port of the RAM when a rising or falling clock edge (i.e., during a clock cycle) is detected by the latch. Accordingly, data present in the register is not automatically applied to the RAM; rather, a clock cycle during which a clock edge occurs is an additional condition.

The data input register of the dual-port RAM-type ring-address FIFO can include another type of latch, namely transparent latches. Where the register contains transparent latches, the data present in the data input register can be automatically applied to the RAM without waiting for the additional condition of a clock edge during a clock cycle applied to the data input register. Rather, transparent latches automatically apply the data to the RAM input port during an enabling level signal of the clock applied to the register (also referred to as a level sensing latches). For example, so long as the clock to the data input register has a level binary value of zero, the transparent latches cause the data present in the register to be applied to the RAM input port. Accordingly, transparent latches allow data to be written to the RAM asynchronously in that they do not require that the clock be at a certain point (either a rising or falling edge); rather, data can be moved from the register to the RAM input port independently of a clock cycle.

A data input register containing transparent latches improves the performance of the dual-port RAM-type ring-address FIFO by increasing the speed at which data is applied to the RAM. Transparent latches reduce the time necessary to apply data inputted to the data input register to the input port because a clock cycle is not necessary. Accordingly, transparent latches increase the speed at which data is available to be read (also referred to as the latency period or elimination of the pipeline stage, or the stage between clock edges necessary for use of a edge-triggered latch in the data input register).

However, a dual-port RAM-type ring-address FIFO with a data input register containing transparent latches cannot use the method of the '318 patent to detect memory, addressing and functional faults which may occur. This is because the data input register containing such transparent latches automatically applies data present in the register to the RAM when the clock to such register has an enabling level signal. Accordingly, there is a need for a technique to detect memory, addressing and functional faults that may occur in a dual-port RAM-type ring-address FIFO with a data input register containing transparent latches.

SUMMARY OF THE INVENTION

Briefly, in accordance with our invention, a method is provided for testing a dual-port RAM-type ring-address FIFO with Design For Testability features and having a data input register with transparent latches, to detect memory, addressing and functional faults. The transparent latches of the data input register affect the operation and testing of such FIFO when the clock to such register contains an active level in two respects: first, during a Write Operation, data applied to the data input register is automatically applied to the RAM through the RAM input port; and second, during a Read Operation where instead of the read shift register being incremented to address the next successive memory location in the RAM, the read shift register is inhibited to remain at the memory location at which the read operation was performed (hereinafter referred to as a Read Inhibit Operation). As a result of the Read Inhibit Operation, when a binary value is read, the complementary binary value is applied to the data input register such that it is automatically written to the RAM at the memory location addressed by the write shift register.

The first aspect of implementing the transparent latches increases the speed of the FIFO based on the increase in speed of data inputted to and, accordingly, available to be read from such FIFO. The second aspect affects the operation of the FIFO in that where a Read Inhibit Operation is performed, the complementary binary value automatically written to the RAM memory location may be read rather than the actual contents of such location prior to being written to. Accordingly, our invention implements the data input register transparent latches such that the write and read shift registers do not address the same memory location of the RAM during such Read Inhibit Operation. More particularly, in an illustrative embodiment of our invention, during a Read Inhibit Operation, the write shift register addresses the memory location of the RAM immediately preceding the memory location addressed by the read shift register.

The method is practiced by causing the FIFO to execute a first sequence of operations, including a first set of functional operations. The first sequence of operations, when executed, causes the FIFO to manifest certain functional faults when present. Following the first operation sequence, the FIFO executes a second sequence of operations. The second sequence of operations, when executed, detects a second set of functional faults, including faults associated with the re-transmit and reset function of the FIFO. Next, the FIFO executes a third sequence of operations. The third sequence of operations detects a third set of functional faults, a first set of memory faults, and a first set of addressing faults. The fourth sequence of operations detects faults associated with an output data evaluator. The fifth sequence of operations detects retention faults. The first and second sets of addressing faults comprise the entire set of potential addressing faults while the first and second sets of memory faults comprise all of the potential memory faults. By executing the first, second, third, fourth and fifth sequences of operations, all of the potential memory, addressing and functional faults of the FIFO are detected.

BRIEF DESCRIPTION OF THE DRAWINGS

The foregoing and other features and advantages of the present invention will be more readily apparent from the following detailed description when read in conjunction with the accompanying drawings, wherein.

DESCRIPTION OF ILLUSTRATIVE EXEMPLARY EMBODIMENTS

Figure 1:
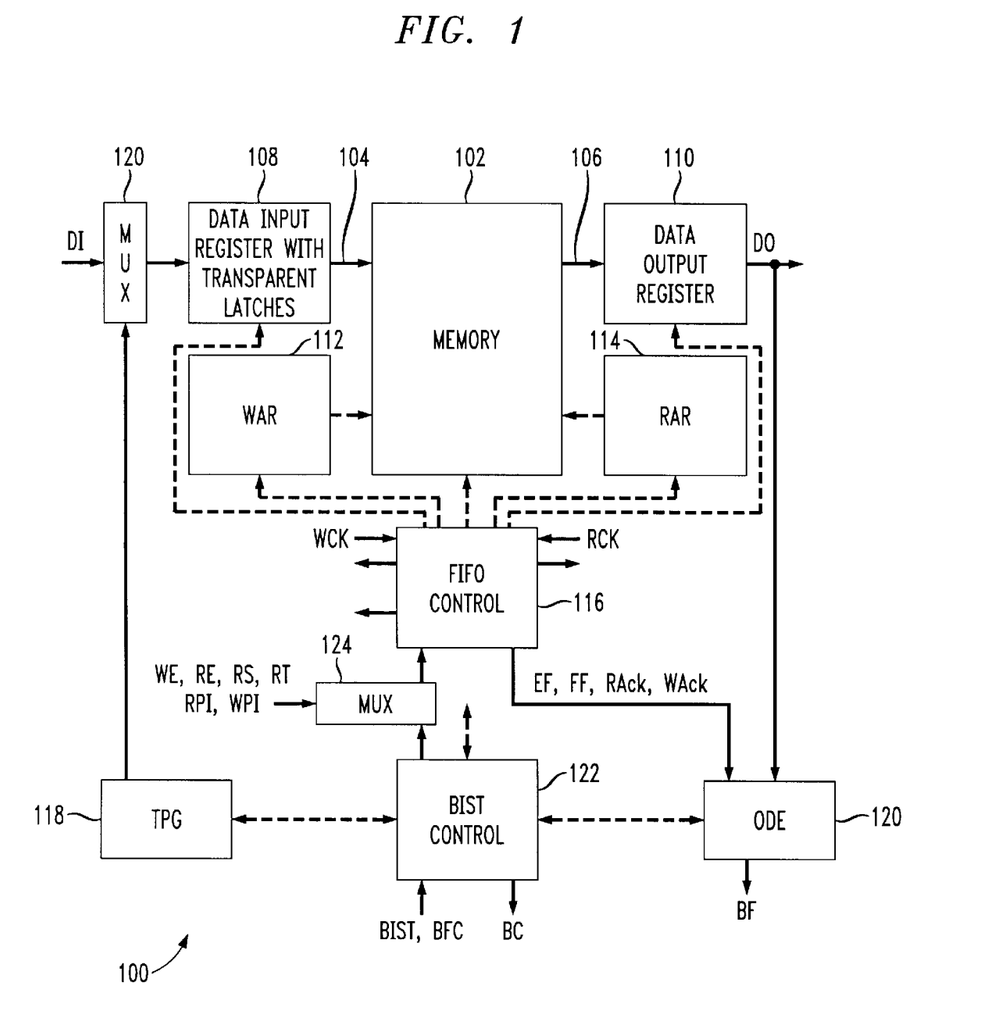
FIG. 1 is a block schematic diagram of a ring-address FIFO having a dual-port RAM as its memory element, a data input register with transparent latches and Design For Testability features, to which our present invention may be applied.

FIG. 1 illustrates a dual-port RAM-type ring-address First-In First-Out (FIFO) memory device 100 comprised of a Random Access Memory (RAM) 102 that has n storage rows (not shown), each row storing a word B bits wide.

The RAM 102 has separate input and output ports 104 and 106, respectively, through which data is written to, and read from, respectively, the RAM 102. The input port 104 of the RAM 102 is coupled to a data input register 108. The register 108 contains a series of transparent latches (not shown). The operations and signals for such operations of the transparent latches are well known, as shown in Neil H. E. Weste and Kamran Eshraghian, *Principles of CMOS VLSI Design*: Chapter 1, Introduction to CMOS Circuits, No. 1.5.7. Memory-Latches and Registers, pp. 19–20, 2d Edition (1993), which is incorporated in its entirety herein by reference. Accordingly, while the operation of the transparent latches is described as to its affect on the application of data from the data input register 108 to the RAM 102, the transparent latches will not be further described herein.

A transparent latch is a flip-flop with two bistable states based on the level of a clock (not shown) to the data input register 108. In the illustrative embodiment, when the clock has a binary value of zero, the transparent latches function to pass data inputted to the register 108 automatically to the RAM 102. In addition, when the clock to the register 108 has a binary value of one, the transparent latches do not allow data in the register 108 to pass to the RAM 102. Accordingly, the states of each transparent latch are dependent upon a level clock signal rather than the application of a clock edge to the data input register 108. In this way, the transparent latches allow data to be written to the RAM 102 asynchronously in that they are triggered by a level signal rather then a clock cycle (providing a clock edge). The transparent latches are also referred to as level sense latches based on such functionality. The RAM output port 106 is coupled to a data output register 110 that buffers outgoing data from the RAM 102 before such data is placed on a Data Output (DO) line.

Figure 2:
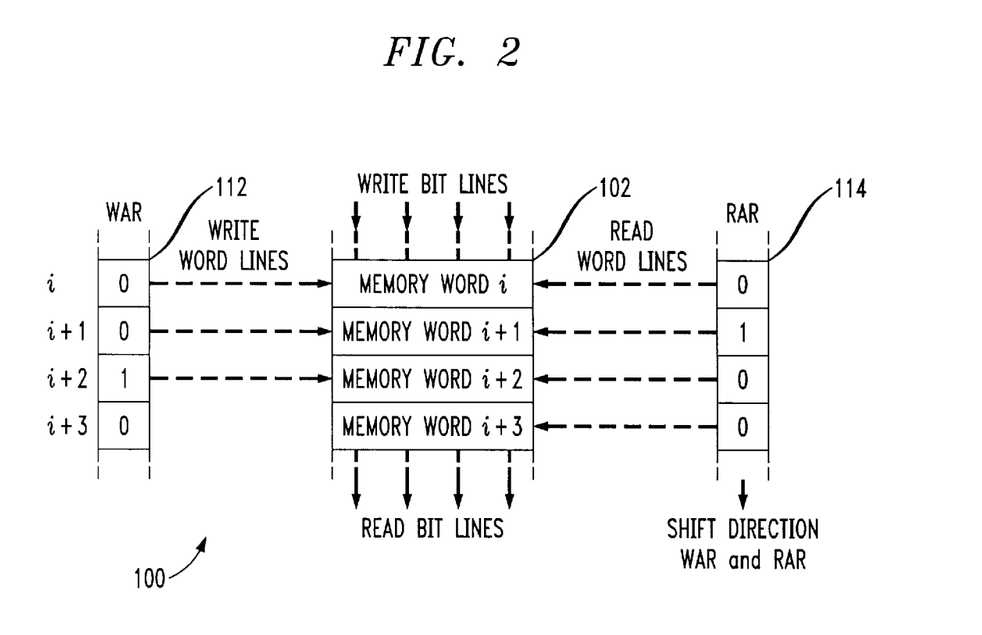
FIG. 2 is a block schematic diagram of a portion of the FIFO of FIG. 1 showing the manner in which the RAM is addressed.

The FIFO 100 further includes a Write Address Register (WAR) 112 and a Read Address Register (RAR) 114, each n bits wide. Referring to FIG. 2, both the WAR 112 and the RAR 114 contain a pattern of n−1 "0s" and a single "1" (in bit positions indicated by an integer with base value i, where i is an integer). The position of the "1" in the pattern stored in the WAR 112 and RAR 114 corresponds to the particular word in the RAM 102 addressed by the WAR 112 and RAR 114, respectively. In effect, the WAR 112 and RAR 114 provide a pointer to the RAM 102 memory location for writing or reading, respectively, data stored in such location. For example, when a "1" is present in the i+2 position of the WAR 112, then the WAR 112 addresses the i+2 word in the RAM 102.

Referring again to FIG. 1, the FIFO 100 also includes a control block 116, typically a state machine, for controlling the operation of the FIFO 100 in response to a set of externally-supplied signals supplied to the FIFO 100 through a multiplexer 124. The externally supplied signals include a Write Enable (WE) and a Read Enable (RE) signal for controlling the WAR 112 and RAR 114, respectively. When the WE and RE signals are asserted at a logic "1" level, the control block 116 causes the WAR 112 and RAR 114, respectively, to be incremented to address the next successive location in the RAM 102 that is to be written to, and read from, respectively. A Write Clock (WCK) signal is also input to the control block 116 to cause the control block to apply such WCK signal to the data input register 108. The control block 116 controls such signal to provide a binary zero value when data appearing at the data input register 108 should automatically be applied to the RAM 102 (hereinafter referred to as an active level WCK) and a binary one value when data appearing at the register 108 should not be provided to the RAM 102 (hereinafter referred to as an inactive level WCK). In addition, a Read Clock (RCK)

signal is input to the control block 116 to cause the control block to clock the data output register 110 which has edge-triggered latches in order to read data from the RAM 102.

The control block 116 is also responsive to Reset (RS) and Re-Transmit (RT) signals externally supplied to the FIFO through the multiplexer 124. Upon receipt of the RS signal, the control block 116 brings the FIFO 100 to its initial state by resetting the WAR 112 and RAR 114 so both registers address the first word (i.e., Initial Address (IA)) of the RAM 102. That is, the value of the 0 position of both the WAR 112 and RAR 114 is a logic "1" while the values of the 1 to n−1 positions of the WAR 112 and RAR 114 are logic "0". For example, the value of the WAR 112 and the RAR 114 IA is 1,0,0 . . . 0. Upon receipt of the RT signal, the control block 116 resets the RAR 114 so that the RAR 114 now addresses the IA of the RAM 102.

The control block 116 not only controls the operation of the FIFO 100 but also generates certain signals (flags) indicative of the operation of the FIFO. For example, the FIFO generates a Full FIFO (FF) flag and an Empty FIFO (EF) flag. The FF flag is set to a logic high or "1" level when the RAM 102 is full (i.e., the RAM contains n unread words). Conversely, the FF flag is set to logic low or "0" level when the FIFO 100 is not full (i.e., one or more of the n words in the FIFO 100 has been read). The EF flag is set to a logic high or "1" level when the FIFO 100 contains zero words (i.e., all of n words in the RAM 102 have been read). The EF flag is set to a logic low or "0" level when the FIFO 100 is not empty. Typically, the control block 116 utilizes the status of the FF and EF flags to afford the FIFO 100 Over-Write Protection (OWP) and Over-Read Protection (ORP), respectively. When the FF flag is at a logic high or "1" level, then the control block 116 prevents the occurrence of a Write Operation (WO) while allowing such an operation when FF=0. In a similar fashion, the control block 116 prevents the occurrence of a Read Operation (RO) when the EF flag is at a logic high or "1" level while permitting a RO when EF=0. In addition to the flags FF and EF, the control block 116 generates a Write Acknowledge (WAck) flag and a Read Acknowledge (RAck) flag when a WO and RO, respectively, have occurred.

The design of the FIFO 100 of FIG. 1 also includes elements especially designed for testability in accordance with our invention, including designing the FIFO 100 with Built-In Self-Test (BIST) capability, that is, the capability to test itself. The BIST capability is provided by a BIST control 122. The BIST control 122 controls a Test Pattern Generator (TPG) 118 and a Output Data Evaluator (ODE) 120. The TPG generates test patterns, in the form of vectors, for input to the RAM 102. The test patterns from the TPG 118 are multiplexed by a multiplexer 120 with signals appearing on the Data Input line (DI). During testing intervals, the multiplexer 120 passes test patterns from the TPG 118 to the data input register 108 for input to the RAM 102. During non-testing intervals, the multiplexer 120 passes signals received on the DI line to the RAM 102.

The ODE 120 is coupled to the output of the Output Data Register 110 so as to receive the same data that is output to the Data Output line (DO). In practice, the ODE 120 takes the form of an AND and OR tree (not shown) for ANDing and ORing the data on the DO line to compact the output data from the Data Output Register 110 during test intervals. The output data compacted by the ODE 120 during test intervals takes the form of responses generated by the RAM 102 to the test patterns provided by the TPG 118.

The BIST control 122, which provides overall control of the TPG 118 and the ODE 120, as well as control of the FIFO control block 116, typically comprises a finite state machine (not shown). The control signals from the BIST control 122 are multiplexed by the multiplexer 124 with the WE, RE, RS and RT signals externally supplied to the FIFO block 116 as described previously. The BIST control 122 control signals are also multiplexed by the multiplexer 124 with a pair of control signals, a Write Pointer Inhibit (WPI) and Read Pointer Inhibit (RPI) (provided to the FIFO 100 through such multiplexer 124). The WPI and RPI control signals operate to inhibit the WAR 112 and RAR 114, respectively, from being incremented after a WO and RO, respectively. The pointer inhibit function associated with each of the WAR 112 and RAR 114 is provided for purposes of testability.

The ODE 120 is responsive to the EF, FF, RAck and WAck flags generated by the FIFO control 116. In accordance with the DO signal and the EF, FF, RAck and WAck flags, the ODE 120 operates to generate a BISTFlag (BF) signal. In addition, the BIST control 122 operates to generate a BIST Complete (BC) signal. The BF and BC flags may be accessed by an external test device (not shown) such as a personal computer, to determine the operating status of the FIFO 100.

The FIFO 100 may experience a variety of faults. For instance, the FIFO 100 may experience memory faults associated with the RAM 102. Such memory faults may include:

1. a Stuck-At Fault (SAF) characterized by the presence of a logic "1" or "0" in a memory location in the RAM 102 notwithstanding the fact that a "0" or "1", respectively, had been previously written to that location;

2. a Stuck-Open Fault (SOF) characterized by an open read or write line to each storage location so that the value read from the RAM 102 corresponds to a previously written value rather than its current value;

3. a Transition Fault (TF) characterized by the failure of the value of a bit stored in the RAM 102 to transition from a logic "1" to "0" (or vice versa) following a pair of WOs during which a logic "1" and "0", respectively, (or a logic "0" and "1", respectively) were written;

4. Coupling faults (CFin, CFid and CFst) characterized by inversion, idempotent and state coupling, respectively, of a bit stored in the RAM 102;

5. a Data Retention Fault (DRF) characterized by the loss of a data value stored in a memory bit in the RAM 102 over time;

6. Linked Coupling Faults, characterized by the simultaneous occurrence of two coupling faults and Linked Transition and Coupling Faults, characterized by the simultaneous presence of a linked fault and a coupling fault, (these two types of faults collectively identified by the term (LF)); and 7. Multi-Port Faults (MPF) characterized by faults associated with the mechanism within each storage location that allows for accessing via multiple input and output ports.

In addition to the above-described memory faults, the FIFO 100 may also experience a fault in addressing the words stored in the RAM 102. Such faults, hereinafter referred to as Addressing Faults (AF), can be classified in four categories:

1. AF-I The addressing faults in category I manifest themselves when, after at most n increments, the contents in either the WAR 112 or RAR 114 remain all "0s";

2. AF-II The addressing faults in category II manifest themselves when, after at most n−1 increments, the contents of the WAR 112 or RAR 114 contain more than a single "1";

3. AF-III The addressing faults in category III manifest themselves by all "0s" rather than one or two specific addresses; and 4. AF-IV The addressing faults in category IV manifest themselves by two separate addresses.

Lastly, the FIFO 100 may also experience functional faults as a result of an inability to perform one or more of its above-described functions and/or an inability to generate proper values for the flags FF, EF, WAck and RAck. The FIFO 100 is also deemed to be faulty if the FIFO is able to perform a WO or RO when the FIFO is full or empty, respectively.

In accordance with the invention, a method has been provided for testing the FIFO 100 to detect potential memory faults, addressing faults, and functional faults by causing the FIFO to execute several sequences of functional operations, ROs, WOs, Read Inhibit Operations (RIs) and Write Inhibit Operations (WIs).

The data input register 108 transparent latches of the FIFO 100 with the Design For Testability features according to our invention affect FIFO 100 operation when the WCK contains an active level in two respects: first, during a WO, data input to the data input register 108 is automatically applied to the RAM 102 through the RAM input port 104; and second, as a result of a RI, when a binary value is read from the RAM 102 by the RAR 114, the complementary binary value is applied to the data input register 108 such that it is automatically written to the RAM 102 at the memory location to which the WAR 112 is pointing.

The first aspect of our invention increases the speed of the FIFO 100 based on the increase in speed of data inputted to and, accordingly, available to be read from such FIFO 100. The second aspect affects the operation of the FIFO 100 in that where a RI is executed and the WAR 112 and RAR 114 are pointing to the same memory location, the RO may read the complementary binary value automatically written to the RAM 102 memory location rather than the actual contents of such location prior to being written to. Accordingly, our invention implements the data input register 108 transparent latches such that the WAR 112 pointer and RAR 114 pointer are not placed at the same memory location of the RAM 102 during a RI. More particularly, in an illustrative embodiment of our invention, the WAR 112 pointer is placed at the RAM 102 memory location immediately preceding the memory location to which the RAR 114 points.

Figure 3:
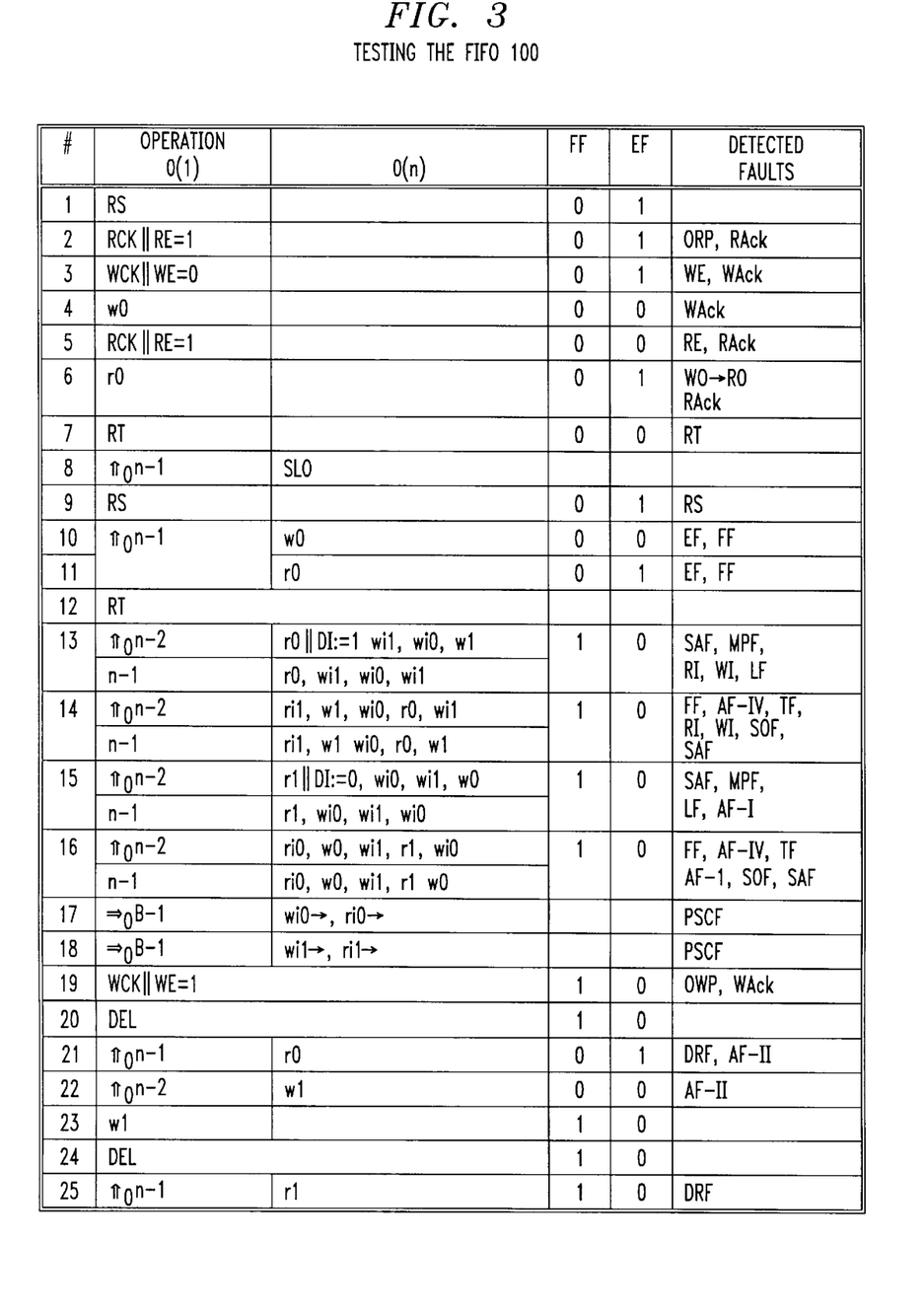
FIG. 3 is a table illustrating the steps of a method in accordance with a first embodiment of the invention, for testing the FIFO of FIG. 1.

The steps of a first illustrative embodiment of the method are illustrated in tabular form in FIG. 3. As seen in that figure, the method comprises twenty-five separate steps, labeled (1) to (25) that have been grouped in five sequences I-V. Prior to actually initiating testing, the FIFO 100 of FIG. 1 is cleared so that the flags FF and EF are at a logic low or "0" level and a logic high or "1" level, respectively. The first operation sequence is commenced by executing step (1), whereupon a RS operation is initiated to cause the FIFO 100 to be reset so that the WAR 112 and the RAR 114 each address the IA, thereby addressing the first word in the RAM 102. Next, step (2) of FIG. 3 is executed and an active (i.e., a logic "1" or high level) RCK signal and an active RE signal are supplied to the control block 116 of FIG. 1 to cause the RAM 102 to commence a RO.

Step (3) is executed after step (2), whereupon an active level WCK signal and an inactive (logic low or "0" level) WE signal are supplied to the control block 116 of FIG. 1. Even though the WCK signal is active, the RAM 102, unless faulty, should not commence a WO while the signal WE is inactive. Therefore, the WAck flag should not be set at this time. Thus, by monitoring the WAck flag, a fault associated with that flag and/or with the WE signal can be detected during step (3). After step (3), step (4) is executed, whereupon a WO is commenced to write a word of all zeros in the first storage location in the RAM 102 of FIG. 2. The WO is commenced upon the assertion of an active WCK signal and an active WE signal; an active level WCK need not be asserted because the WCK already has a active level based on the assertion of such signal in step (3). Upon execution of the WO during step (4), the WAck flag should now be set to indicate that a WO did indeed occur. Moreover, the EF flag should no longer be set because the FIFO 100 should no longer be empty if the WO was executed successfully.

After step (4), step (5) is executed, whereupon an active RCK signal and an inactive RE signal are supplied to the control block 116 of FIG. 1. While the RE signal is inactive, the control block 116 should not initiate a RO unless there is a fault. Thus, the RAck flag should not be set at this time. If the RAck flag has been set, then either the flag itself is faulty and/or there is some fault associated with the RE signal.

Following step (5), step (6) is executed. During step (6), a RO is executed to determine if a word of all "0s" has been written at the first location of the RAM 102 during the previous WO. The RO during step (6) is commenced by asserting an active RCK signal and an active RE signal. If the RO has been successfully executed during step (6), the RAck flag should now be set. Further, if the RO has been successfully executed, then the EF flag should also be set because the FIFO 100 of FIG. 1 should now be empty (i.e., all of the words previously written in the RAM 102 have now been read). A failure of the RAck flag to be set during step (6) indicates a fault associated with that flag and/or a fault associated with an inability to successfully execute a write operation and a successive read operation.

As may now be appreciated, steps (1)–(6), comprising the first sequence of operations, serve to detect a first set of functional FIFO faults associated with the ORP, WE and RE functions, as well as faults associated with the RAck and WAck flags.

Step (7) follows step (6). During step (7), the control block 116 of FIG. 1 causes the FIFO 100 to commence a RT operation. Following the RT operation, the RAR 114 should be reset to the IA to address the first word in the RAM 102. Previously, this word had been read during step (6) so that the EF flag is now set to a logic high or "1" level, signifying that all of the words previously written in the FIFO 100 of FIG. 1 have now been read. However, once the RT operation is commenced during step (7), the RAR 114 of FIG. 1 once again addresses the first word in the FIFO 100 that is assumed to be unread. As a consequence, the EF flag is now zero as is the FF flag. Following step (7), step (8) is executed whereupon a Serial Loading Operation (SLO) is initiated to load a value of zero in the IA position in both the WAR 112 and RAR 114 and ones in the other positions. During execution of the SLO, the n-bit circular loop associated with each of the WAR 112 and RAR 114 is broken, allowing each register to be scanned by n operations. In this way, the reset function of the FIFO 100 of FIG. 1 can be tested by initiating a single RS operation during step (9), thereby reducing the complexity of the operation associated with detecting faults associated with the RS operation. The RS operation performs two separate functions. First, the RS operation resets both the WAR 112 and RAR 114 so that each address the IA (i.e., the 0th row of storage locations in the RAM 102). If the RS operation has been successfully performed during step (9), then the EF flag, which was onset during step (7), should now be set. The failure of the EF flag to be set at this time signals a fault associated with the RS operation.

Following step (9), a modified "march" algorithm is executed to test for faults associated with the EF and FF flags as well as various memory and addressing faults. The algorithm is contained in steps (10) and (11) wherein a WO and RO are executed n times to write a word of all zeros and then read the word of all zeros as to each successive location in the RAM 102. The algorithm is initiated upon execution of step (10), whereupon a WO is executed at the memory location 0 (i.e., the 0th row of storage locations) of the RAM 102. The RO is then executed at the same memory location 0 to read that location previously written with all zeros. This algorithm is repeated for 0 to n−1 memory locations. Having now written the RAM 102 with data, the EF flag should not be set to a logic "1" or high level. After every execution of step (1), the FF should be a logic "0" because after each WO, a RO has been executed so that the FIFO 100 is not full. If the RO performed during each execution of step (11) was successful, then the EF flag should be asserted after every execution of step (11) because all of the locations in the RAM 102 that were previously written have now been read, rendering the RAM 102 empty (i.e., completely read). Hence, since the FIFO 100 is not full after each execution of step (11), the FF flag should remain at a logic "0". After the last execution of step (11), step (12) is executed and a RT operation is performed to reset the RAR 114.

In steps (13) to (16), another march algorithm is executed. Such algorithm includes RIs and WIs (where the WAR 112 and the RAR 114 are inhibited from being incremented to address the next successive address of the RAM 102). These operations permit the complete detection of idempotent coupling faults (CFids) that require that the FIFO 100 execute at least three separate read and write operations, such as r0 w1 w0, at each storage location, or two operations with reverse address direction, such as r1 w0 r0. A conventional FIFO, is incapable of executing three or more read and write operations at the same storage location and is also incapable of performing inverse addressing operations. However, by the inhibiting the WAR 112 and the RAR 114 by the inhibit operation described above, then three or more read and write operations can be executed at the same location, thus permitting complete detection of CFids. Further, the above-described inhibit operation can be employed to manifest Linking Faults (LFs) which require four read and write operations at each location.

Step (13) is executed n times for memory locations 0 to n−1 to perform a sequence of read and write operations in two sequences: the first set of sequences is performed n−1 times for memory locations 0 to n−2; and the second set of sequences is performed one time for memory location n−1. The first set of sequences is as follows: during each execution of step (13), the DI line is held to a logic "1" or high level while a RO is initiated to read if a word of all zeros is present at a successive one of n−1 storage locations in the RAM 102. However, since the transparent latches are not triggered during a read operation, the high level on the DI line is not automatically written into the RAM 102. After the RO, a pair of WIs are commenced in succession to write a B bit word into the RAM 102 without incrementing the WAR 112. During the first WI, a word of all ones is written, whereupon a word of all zeros is written during the second WI. After the second WI, a WO is commenced where a word of all ones is written in the RAM 102. Thus, during each successive execution of step (13), an RO, two WIs and a WO are executed in succession.

In addition, the second set of sequences of step (13) is as follows: there are four operations, the first three of which are identical to the operations performed on memory locations 0 to n−2. The last operation, however, is a WI such that a B bit word of all ones is written without incrementing the WAR 112. This results in placement of the WAR 112 write pointer at memory location n−1 and the read pointer at memory location 0 (i.e., IA) of the RAM 102. Accordingly, the WAR 112 write pointer is positioned one memory location preceding the RAR 114 read pointer. The purpose of this sequence is to set up the WAR 112 and RAR 114 pointers for the first sequence of step (14). Also, Stuck-at faults (SAFs), Multiport Faults (MPFs), Linking Faults (LFs) as well as RI and WI faults will manifest themselves during step (13). In addition, the values shown for step (13) (as well as steps (14) to (16) which follow such step (13)) for FF and EF are generated at the end of every execution of such steps (13) to (16).

Following step (13), step (14) is executed n times for memory locations 0 to n−1 to perform a sequence of read and write operations in two sequences: the first set of sequences is performed n−1 times for memory locations 0 to n−2; and the second set of sequences is performed one time for memory location n−1. The first set of sequences is as follows: during each execution of step (14), a RI, a WO, a WI, a RO and a WO are performed in sequence. During the RI, a B-bit word is read from the RAM 102 at the currently addressed location, without incrementing the RAR 114 of FIG. 2, to determine if the word is all ones. In addition, during this operation, the complement of the binary value read during the RI is inputted to the data input register 108 and automatically applied to the RAM 102 based on the operation of the transparent latches. However, the WAR 112 write pointer location resulting from step (13) is the memory location n−1, rather than the memory location 0 where the read pointer is located. Therefore, the binary zero value inputted to the data input register 108 is written to the memory location n−1 rather than the memory location 0 being read. The RI operation accurately reads the data from memory location 0 unaffected by the operation of the transparent latches, that is writing a binary zero to memory location n−1.

The WO executed next writes data into the currently-addressed location in the RAM 102 and the WAR 112 pointer is incremented. The currently-addressed location is the memory location n−1. Accordingly, a word of all ones is written to memory location n−1 and the write pointer is incremented to memory location 0. The purpose of the WO is to move the write pointer to the memory location 0 in order to manipulate the data where the read pointer is positioned. During the WI executed next, a word of all zeros is written into the currently-addressed location in the RAM 102, the memory location 0, without incrementing the WAR 112.

During the RO executed after the WI, the currently-addressed location in the RAM 102, memory location 0, is read to determine if the word is all zeros. However, during the RO, the RAR 114 of FIG. 2 is incremented to memory location 1 and the transparent latches do not affect the read operation. Following the RO, a WI is initiated to write a word of all ones to the memory location 0 and the WAR 112 is not incremented such that the write pointer remains at the memory location 0. Accordingly, for each execution of step (14) for memory locations 0 to n−2, the WAR 112 points to the memory location immediately preceding the memory location to which the RAR 114 is pointing. Accordingly, the RI operations in step (14) performed on each successive memory location correctly test the value of such memory locations rather than the data automatically applied to the RAM 102 as a result of the operation of the transparent latches.

In addition, the second set of sequences of step (14) is as follows: there are five operations, the first four of which are identical to the operations performed on memory locations 0 to n–2. The last operation, however, is a WO such that a B-bit word of all ones is written and the WAR 112 is incremented. This results in placement of the write pointer at memory location 0 and the read pointer at memory location 0 of the RAM 102. Accordingly, the WAR 112 and RAR 114 pointers are positioned at the same memory location. The purpose of this sequence is to set up the pointers for the first sequence of step (15). Upon the last execution of step (14), type IV addressing faults, Transition Faults (TFs), and faults associated with the WI and RI operations and with the FF will manifest themselves.

After step (14), step (15) followed by step (16) are executed. Steps (15) and (16) are identical to steps (13) and (14) as to the order of WO, RO, WI and RI operations and method of incrementing the WAR 112 and RAR 114. The difference between the set of steps is that the opposite binary values are applied to the RAM 102. This results in the detection of an additional fault, namely the type I addressing faults. In addition, the same faults detected by steps (13) and (14) will be detected as to the complementary binary values for testing the FIFO 100.

After the last execution of step (16), step (17) is executed B times during which a WI is executed to write a walking zeros pattern without incrementing the WAR 112 of FIG. 2. After each WI, a RI is executed to read whether the walking zeros pattern was indeed written. After the last execution of step (17), step (18) is executed B times during which a WI and a RI are executed in succession to write a walking ones pattern and then to read the walking ones pattern just written, respectively. Steps (17) and (18) collectively serve to manifest Programmable Space Compaction Faults (PSCFs) associated with the compaction provided by the ODE 120 of FIG. 1. After the last execution of step (18), step (19) is executed with an active level WCK signal while maintaining the WE signal at a logic "1" or high level to attempt a WO. However, at this time, the FF should be at a logic high or "1", thus precluding a WO if the OWP feature of the FIFO 100 is operational. Thus, by monitoring the status of the WAck flag during step (19), a fault with this flag, and/or with the OWP feature of the FIFO 100, can be detected.

Step (20) is executed next, whereupon a delay occurs. Following step (20), step (21) is executed n times. During each execution of step (20), a RO is performed to read whether a word of all zeros is present at each successive location in the RAM 102 of FIG. 2. At the end of step (21), type II addressing faults will manifest themselves. Following step (21), step (22) is executed n–1 times to write a word of all ones. Step (21) serves to manifest DRFs by detecting for retention of words of all zeros.

Step (23) is executed after step (22). During step (23), a WO is executed to write a word of all ones in the currently-addressed location in the RAM 102. Thereafter, step (24) is executed, whereupon another delay occurs in order to detect data retention faults occurring because of complementary values (all ones). Finally, step (25) is executed n times. During each execution of step (25), a RO is performed to read whether a word of all ones is present at each successively-addressed location in the RAM 102 of FIG. 2. DRFs that have not previously manifested themselves will do so during step (25) because, at this time, an examination is made whether words of all ones have been retained. For steps (21) to (25), the values shown for FF and EF are generated at the end of the last execution of such steps (21) to (25).

Figure 4:
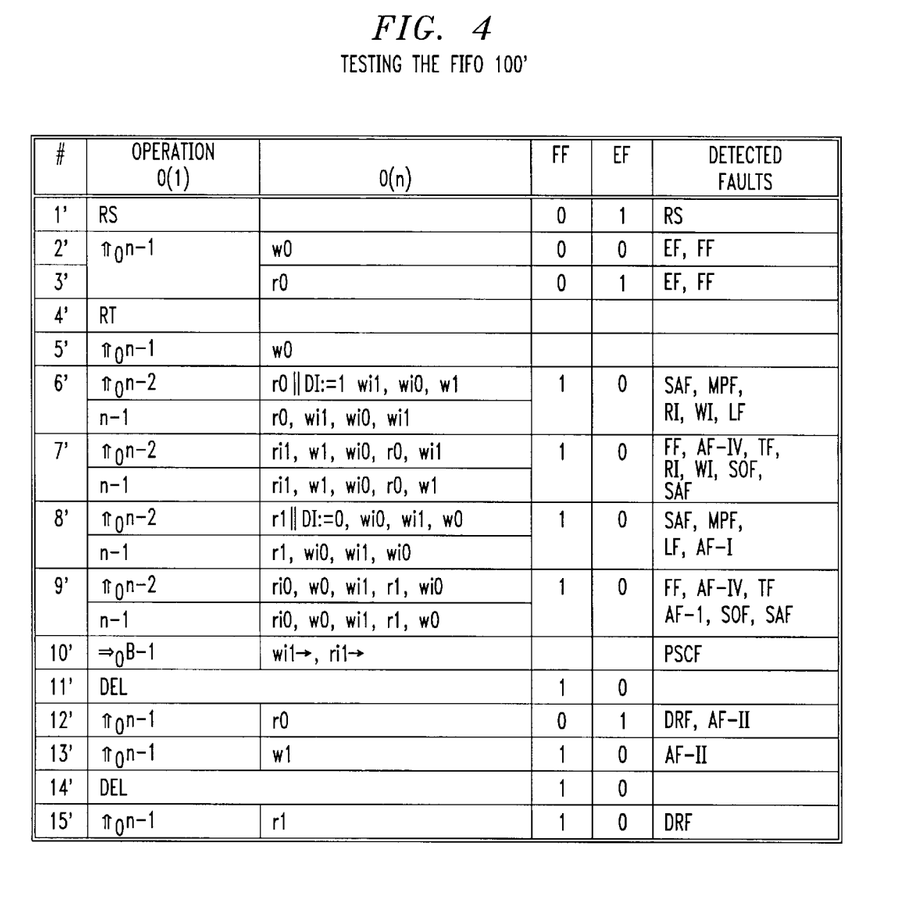
FIG. 4 is a table illustrating the steps of a method in accordance with a second embodiment of the invention, for testing a FIFO with predetermined design parameters.

Referring to FIG. 4, the steps of a second illustrative embodiment of the method for testing a FIFO 100' (not shown) with predetermined design parameters are illustrated in tabular form. As seen in that figure, the method comprises fifteen separate steps, labeled (1')–(15') that have been grouped in four sequences I-IV. The number of steps of the method in FIG. 4 is reduced from the FIG. 3 steps because the FIFO 100' does not contain the functionality tested in the eliminated steps. The FIFO 100' can be designed with reduced functionality where it is not needed in the application in which the FIFO 100' is implemented. For example, step (2) shown in FIG. 3 for testing the FIFO 100 is not implemented for testing the FIFO 100' because the FIFO 100' does not include the Over-Write Protection function. In this way, with reduced functions, the FIFO 100' can operate with increased speed and reduced fault rate since there are fewer operations, which can malfunction.

Steps (1') to (4') of the method for testing the FIFO 100' are identical to the previously described steps (9) to (12) shown in FIG. 3 for testing the FIFO 100 shown in FIG. 1. That is, the steps (1') to (4') operate in the same manner to detect the same faults of the steps (9) to (12) of FIG. 3.

Step (5') is executed after step (4'). During step (5'), WOs of all zeros are executed at each memory locations 0 to n–1 of the RAM 102' (not shown). This operation serves two purposes: in the event that there is a re-transmit error such that the execution of RT in step (4') does not cause the WAR 112 pointer to move to the memory location 0, WOs for the n memory locations serve to move to the pointer to such memory location 0; and writing data to each memory location of the RAM 102' serves to initialize the memory locations to a known address for the proper execution of steps (6') to (9'). Since step (5') is a corrective step in the event of a fault detected as a result of step (4') and an initialization step for steps (6') to (9'), it does not detect faults.

Steps (6') to (9') for testing the FIFO 100' are identical to the previously described steps (13) to (16) shown in FIG. 3. The steps (6') to (9') of FIG. 4 operate in the same manner to detect the same faults of the steps (13) to (16) of FIG. 3.

Step (10') shown in FIG. 4 for testing the FIFO 100' serves to manifest PSCFs associated with the compaction function provided by the ODE 120' (not shown) for use in the FIFO 100'. Step (10') is identical to step (18) of FIG. 3 as to operating in the same manner to detect the same faults. While steps (17) and (18) in FIG. 3 are used to test the ODE 120 of FIG. 1, the equivalent of FIG. 3 step (17) is not needed in the method of FIG. 4 because the ODE 120' uses solely an OR gate such that the FIG. 3 step (17) operation for testing an AND gate is not necessary.

Steps (11') to (15') for testing the FIFO 100' are identical to the previously described steps (20) to (25) (where steps (22) to (23) are combined into the single step (13')). The FIG. 4 steps (11') to (15') operate in the same manner to detect the same faults of the steps (20) to (25) of FIG. 3.

The foregoing describes a method for testing dual-port, RAM-Type ring-address FIFOs 100 and 100' including the data input register 108 containing a series of transparent latches to test for memory, addressing and functional faults. It is to be understood that the above-described embodiments are merely illustrative of the principles of the invention. Various modifications and changes may be made thereto by those skilled in the art which will embody the principles of the invention and fall within the spirit and scope thereof. For example, the value of the binary level clock signal inputted to the data input registers 108 and 108' (not shown) is a matter of design preference and does not limit our invention. In addition, the values read or written in the steps of the methods of our invention are necessary only to the extent of their complementary relationship to one another. For example, in an alternative embodiment, each of the binary values in the steps of the method may be reversed, so long as each value is reversed. In addition, the invention is not to be considered limited by the specific examples illustrated herein, but by the appended claims.

What is claimed is:

1. A method for testing a dual-port, RAM-type FIFO having a data input register with a plurality of transparent latches, a read address register for addressing one of a plurality of memory locations in the FIFO at a time to be read from, a write address register for addressing one of a plurality of memory locations in the FIFO at a time to be written to, a built-in test pattern generator and a built-in output data evaluator, as well as a built-in test controller for controlling the test pattern generator and the output data evaluator, said method comprising the steps of:

executing a first sequence of operations, including a set of functional operations, a first write operation, and a first read operation, to test the ability of the FIFO to read and write data;

executing a second sequence of operations, including a re-transmit operation, to test the ability of the FIFO to reset itself;

executing a third sequence of operations, including at least one read inhibit operation during which the FIFO is read without incrementing said read address register to a next successive of said memory locations and wherein, when said read inhibit operation is performed on an i memory location, said i being an integer equal to one of said memory locations in the FIFO addressed by said read address register, said write address register addresses one of said memory locations in the FIFO which is different from said i memory location, to perform a modified march test on the FIFO to detect memory and addressing faults;

executing a fourth sequence of operations to detect faults associated with the output data evaluator; and executing a fifth sequence of operations, including a delay interval, to detect data retention faults.

2. The method according to claim 1 wherein said functional operations of said first sequence include a reset operation and a re-transmit operation.

3. The method according to claim 1 wherein the first sequence of operations includes at least one functional operation during which a read clock signal at a prescribed level is supplied to the FIFO while a read enable signal at a first prescribed level is also supplied for the purpose of testing the ability of the FIFO to execute a read operation when the FIFO is empty.

4. The method according to claim 1 wherein the first sequence of operations includes a functional operation during which a write clock signal at a first prescribed level is supplied to the FIFO while a write enable signal at a prescribed level is also supplied to determine whether the FIFO is capable of executing a write operation when the FIFO is not full.

5. The method according to claim 1 wherein the second sequence of operations detects faults associated with a re-transmit and reset functionality of the FIFO.

6. The method according to claim 1 wherein the second sequence of operations includes a serial loading operation during which each of the read address and write address registers are loaded with data.

7. The method according to claim 1 wherein said one memory location addressed by said write address register precedes said i memory location.

8. The method according to claim 7 wherein said one memory location addressed by said write address register is an i−1 memory location of the FIFO.

9. The method according to claim 1 wherein the third sequence of operations further including read and write operations executed in sequence a plurality of times to ascertain whether the FIFO can accurately indicate when it is empty.

10. The method according to claim 1 wherein the third sequence of operations further including read and write operations executed in sequence a plurality of times to ascertain whether the FIFO can accurately indicate when it is full.

11. The method according to claim 1 wherein the fifth sequence of operations includes at least one delay interval between read and write operations.

12. The method according to claim 1 wherein the fifth sequence of operations includes two delay intervals, each delay interval occurring between a write and read operations.

13. A method for testing a dual-port, RAM-type FIFO having a data input register with a plurality of transparent latches, a read address register for addressing one of a plurality of memory locations in the FIFO at a time to be read from, a write address register for addressing one of a plurality of memory locations in the FIFO at a time to be written to, a built-in test pattern generator and a built-in output data evaluator, as well as a built-in test controller for controlling the test pattern generator and the output data evaluator, said method comprising the steps of:

executing a first sequence of operations, including a set of functional operations, a first write operation, and a first read operation, to test the ability of the FIFO to read and write data;

executing a second sequence of operations, including a re-transmit operation, to test the ability of the FIFO to reset itself;

executing a third sequence of operations, including at least four sets of operations for 0 to n−1 memory locations in the FIFO, said n being an integer equal to the number of said memory locations in the FIFO, said first and said third sets including read, write, and write inhibit operations and said second and fourth sets including read, write, read inhibit and write inhibit operations, wherein each of said four sets further includes one of a plurality of first sub-sets for said 0 to n−2 memory locations and one of a plurality of second sub-sets for said n−1 memory location and wherein said sets are executed sequentially and the last operation of each of said first sub-sets and said second sub-sets is the write operation or write inhibit operation and, wherein, for each set, when the last operation of said one first sub-set in said set is the write operation, the last operation of said one second sub-set in said set is the write inhibit operation and the second operation of said next first sub-set in said next set is the write operation, to perform a modified march test on the FIFO to detect memory and addressing faults;

executing a fourth sequence of operations to detect faults associated with the output data evaluator; and executing a fifth sequence of operations, including a delay interval, to detect data retention faults.

14. A method for testing a dual-port, RAM-type FIFO having a data input register with a plurality of transparent latches, a read address register for addressing one of a plurality of memory locations in the FIFO at a time to be read from, a write address register for addressing one of a plurality of memory locations in the FIFO at a time to be written to, a built-in test pattern generator and a built-in output data evaluator, as well as a built-in test controller for controlling the test pattern generator and the output data evaluator, said method comprising the steps of:

executing a first sequence of operations, including a re-transmit operation, to test the ability of the FIFO to reset itself;

executing a second sequence of operations, including at least one read inhibit operation during which the FIFO is read without incrementing said read address register to a next successive of said memory locations and wherein, when said read inhibit operation is performed on an i memory location, said i being an integer equal to one of said memory locations in the FIFO addressed by said read address register, said write address register addresses one of said memory locations in the FIFO which is different from said i memory location, to perform a modified march test on the FIFO to detect memory and addressing faults;

executing a third sequence of operations to detect faults associated with the output data evaluator; and     executing a fourth sequence of operations, including a delay interval, to detect data retention faults.

15. The method according to claim 14 wherein said one memory location addressed by said write address register precedes said i memory location.

16. The method according to claim 15 wherein said one memory location addressed by said write address register is an i−1 memory location of the FIFO.

17. The method according to claim 14 wherein the third sequence of operations further including read and write operations executed in sequence a plurality of times to ascertain whether the FIFO can accurately indicate when it is empty.

18. The method according to claim 14 wherein the third sequence of operations further including read and write operations executed in sequence a plurality of times to ascertain whether the FIFO can accurately indicate when it is full.

19. The method according to claim 14 wherein the fourth sequence of operations includes at least one delay interval between read and write operations.

20. A method for testing a dual-port, RAM-type FIFO having a data input register with a plurality of transparent latches, a read address register for addressing one of a plurality of memory locations in the FIFO at a time to be read from, a write address register for addressing one of a plurality of memory locations in the FIFO at a time to be written to, a built-in test pattern generator and a built-in output data evaluator, as well as a built-in test controller for controlling the test pattern generator and the output data evaluator, said method comprising the steps of:

executing a first sequence of operations, including a re-transmit operation, to test the ability of the FIFO to reset itself;

executing a second sequence of operations, including at least four sets of operations for 0 to n−1 memory locations in the FIFO, said n being an integer equal to the number of said memory locations in the FIFO, said first and said third sets including read, write, and write inhibit operations and said second and fourth sets including read, write, read inhibit and write inhibit operations,         wherein each of said four sets further includes one of a plurality of first sub-sets for said 0 to n−2 memory locations and one of a plurality of second sub-sets for said n−1 memory location and         wherein said sets are executed sequentially and the last operation of each of said first sub-sets and said second sub-sets is the write operation or write inhibit operation and, wherein, for each set, when the last operation of said one first sub-set in said set is the write operation, the last operation of said one second sub-set in said set is the write inhibit operation and the second operation of said next first sub-set in said next set is the write operation, to perform a modified march test on the FIFO to detect memory and addressing faults;

executing a third sequence of operations to detect faults associated with the output data evaluator; and     executing a fourth sequence of operations, including a delay interval, to detect data retention faults.

\* \* \* \* \*

UNITED STATES PATENT AND TRADEMARK OFFICE
CERTIFICATE OF CORRECTION

PATENT NO.    : 5,978,935
DATED         : November 2, 1999
INVENTOR(S)   : Ilyoung Kim It is certified that error appears in the above-identified patent and that said Letters Patent is hereby corrected as shown below:

<u>Title page,</u>
Item [73] Assignee, please add -- LUCENT TECHNOLOGIES INC. 600 MOUNTAIN AVE P.O. BOX 636 MURRAY HILL, NEW JERSEY 07974 --.

Signed and Sealed this

Ninth Day of October, 2001

*Attest:*

NICHOLAS P. GODICI
*Attesting Officer*    *Acting Director of the United States Patent and Trademark Office*